United States Patent
Kardasz et al.

(10) Patent No.: US 10,388,853 B2
(45) Date of Patent: Aug. 20, 2019

(54) MAGNETIC MEMORY HAVING A PINNING SYNTHETIC ANTIFERROMAGNETIC STRUCTURE (SAF) WITH COBALT OVER PLATINUM (PT/CO) BILAYERS

(71) Applicant: Spin Memory, Inc., Fremont, CA (US)

(72) Inventors: Bartlomiej Adam Kardasz, Pleasanton, CA (US); Jorge Vasquez, San Jose, CA (US); Georg Wolf, San Francisco, CA (US); Mustafa Pinarbasi, Morgan Hill, CA (US)

(73) Assignee: SPIN MEMORY, INC., Fremont, CA (US)

(*) Notice: Subject to any disclaimer, the term of this patent is extended or adjusted under 35 U.S.C. 154(b) by 0 days.

(21) Appl. No.: 15/859,141

(22) Filed: Dec. 29, 2017

(65) Prior Publication Data

US 2019/0207085 A1 Jul. 4, 2019

(51) Int. Cl.
| | |
|---|---|
| *G11C 11/16* | (2006.01) |
| *H01F 10/32* | (2006.01) |
| *H01L 43/02* | (2006.01) |
| *H01L 43/08* | (2006.01) |
| *H01L 43/10* | (2006.01) |
| *H01L 43/12* | (2006.01) |

(52) U.S. Cl.
CPC ............ *H01L 43/02* (2013.01); *G11C 11/161* (2013.01); *H01F 10/3254* (2013.01); *H01F 10/3286* (2013.01); *H01L 43/08* (2013.01); *H01L 43/10* (2013.01); *H01L 43/12* (2013.01)

(58) Field of Classification Search
CPC ......... H01L 43/02; H01L 43/08; H01L 43/10; H01L 43/12; H01L 43/00–14; H01L 27/22–228; G11C 11/14; G11C 11/15; G11C 11/161; G11C 11/02–18; G11C 2211/5615; H01F 10/3236; H01F 10/3286; H01F 10/3254; H01F 10/324–3295
See application file for complete search history.

(56) References Cited

U.S. PATENT DOCUMENTS

| | | | |
|---|---|---|---|
| 8,946,837 B2 * | 2/2015 | Watanabe | H01L 43/08 257/421 |
| 9,337,415 B1 * | 5/2016 | Oh | H01L 43/08 |

(Continued)

*Primary Examiner* — Marc Anthony Armand
*Assistant Examiner* — Younes Boulghassoul
(74) *Attorney, Agent, or Firm* — Zilka-Kotab, P.C.

(57) ABSTRACT

A magnetic memory element for Magnetic Random Access Memory. The magnetic memory element has improved reference layer magnetic pinning and reduced dipole fringing field effect on the magnetic free layer. The magnetic memory element includes a magnetic reference layer having a pinned magnetization, a magnetic free layer having a switchable magnetization and a non-magnetic barrier layer between the magnetic reference layer and the magnetic free layer. The magnetic reference layer is exchange coupled with a synthetic anti-ferromagnetic structure that includes a first multi-layer structure, a second multi-layer structure and a non-magnetic anti-parallel exchange coupling layer located between the first and second multi-layer structures. Each of the first and second multi-layer structures includes a plurality of bi-layers of Pt and Co, with the Pt being deposited first and located below the Co.

13 Claims, 3 Drawing Sheets

(56) References Cited

U.S. PATENT DOCUMENTS

| | | | | |
|---|---|---|---|---|
| 2014/0169085 A1* | 6/2014 | Wang | G11C 11/161 | 365/158 |
| 2014/0327095 A1* | 11/2014 | Kim | H01L 43/08 | 257/421 |
| 2015/0129997 A1* | 5/2015 | Tang | H01L 43/12 | 257/427 |
| 2015/0171316 A1* | 6/2015 | Park | H01L 43/10 | 257/421 |
| 2016/0155932 A1* | 6/2016 | Chen | H01L 43/08 | 257/427 |
| 2016/0181508 A1* | 6/2016 | Lee | H01L 43/02 | 257/421 |
| 2016/0315249 A1* | 10/2016 | Kardasz | G11C 11/161 | |
| 2016/0380187 A1* | 12/2016 | Seino | G11C 11/161 | 257/421 |
| 2017/0263859 A1* | 9/2017 | Tang | H01L 43/10 | |
| 2017/0271576 A1* | 9/2017 | O'Brien | H01L 43/08 | |
| 2017/0271578 A1* | 9/2017 | O'Brien | H01L 43/08 | |
| 2017/0317274 A1* | 11/2017 | Seino | H01L 43/08 | |
| 2019/0051822 A1* | 2/2019 | Chatterjee | H01L 27/222 | |

\* cited by examiner

MAGNETIC MEMORY HAVING A PINNING SYNTHETIC ANTIFERROMAGNETIC STRUCTURE (SAF) WITH COBALT OVER PLATINUM (PT/CO) BILAYERS

FIELD OF THE INVENTION

The present invention relates to magnetic random access memory (MRAM), and more particularly to a magnetic random access memory element having improved reference layer pinning robustness and reduced fringing field.

BACKGROUND

Magnetic Random Access Memory (MRAM) is a non-volatile data memory technology that stores data magnetoresistive cells, such as Magnetoresistive Tunnel Junction (MTJ) elements. At their most basic level, such MTJ elements include first and second magnetic layers that are separated by a thin, non-magnetic tunnel barrier layer, which may be constructed of an insulating barrier material, such as MgO, $Al_2O_3$, etc. The first magnetic layer, which may be referred to as a reference layer, has a magnetization that is fixed in a direction that is perpendicular to that of a plane of the layer. The second magnetic layer has a magnetization that is free to move so that it may be oriented in either of two directions that are both generally perpendicular to the plane of the free magnetic layer. Therefore, the magnetization of the free layer may be either parallel with the magnetization of the reference layer or anti-parallel with the direction of the reference layer (i.e., opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. Each electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free layer and the reference layer are oriented in the same direction, the spin of the electrons in the free layer are generally in the same direction as the orientation of the spin of the electrons in the reference layer. Because these electron spins are generally in the same direction, the electrons may pass relatively easily through the tunnel barrier layer. However, if the orientations of the magnetizations of the free layer and the reference layer are opposite to one another, the spin of electrons in the free layer will generally be opposite to the spin of electrons in the reference layer. In this case, electrons do not easily pass through the barrier layer, resulting in a higher electrical resistance through the MTJ stack.

Because the MTJ element may be switched between low and high electrical resistance states, it may be used as a memory element to store data. For example, the low resistance state may be read as a "1" or one, whereas the high resistance state may be read as a "0" or zero. In addition, because the magnetic orientation of the magnetic free layer remains in its switched state without any electrical power being provided to the element, the memory storage provided by the MTJ element is robust and non-volatile.

To write a bit of data to the MTJ cell, the magnetic orientation of the magnetic free layer is switched from a first direction to a second direction that is 180° from the first direction. This may be accomplished, for example, by applying a current through the MTJ element in a direction that is perpendicular to the planes of the layers of the MTJ element. An electrical current applied in one direction will switch the magnetization of the free layer to a first orientation, whereas an electrical current applied in a second direction will switch the magnetic of the free layer to a second, opposite orientation.

Once the magnetization of the free layer has been switched by the current, the state of the MTJ element may be read by detecting a voltage across the MTJ element, thereby determining whether the MTJ element is in a "1" or "0" bit state. Advantageously, once the switching electrical current has been removed, the magnetic state of the free layer will remain in the switched orientation until some other time when an electrical current is applied to switch the MTJ element to the opposite state. Therefore, the recorded data bit is non-volatile in that it remains intact (the magnetic orientation of the free layer does not change) in the absence of any electrical current being supplied.

SUMMARY

The present invention provides a magnetic memory element that includes a magnetic reference layer, a magnetic free layer and a non-magnetic barrier layer located between the magnetic free layer and the magnetic reference layer. The memory element also includes a synthetic antiferromagnetic structure that further includes first and second multi-layer structures and a non-magnetic exchange coupling layer located between the first and second multi-layer structures. Each of the first and second multi-layer structures includes a plurality of bi-layers of Pt and Co.

The second multi-layer structure can be exchange coupled with the magnetic reference layer, and bi-layers of each of the first and second multi-layer structures is preferably constructed as a layer of Pt and a layer of Co formed over the layer of Pt.

The multi-layer structures of the synthetic anti-ferromagnetic structure advantageously result in greatly increased perpendicular magnetic anisotropy which greatly increases the robustness of pinning of the magnetic reference layer. In addition, the arrangement of Pt/Co bi-layers in the multi-layer structure leads to overall lowering of magnetic moment of these layers leading to decreased dipole fringing fields. This decrease in dipole fringing fields contributes to magnetic free layer stability which improves data retention.

These and other features and advantages of the invention will be apparent to one of skill in the art upon reading of the following detailed description of the embodiments in conjunction with the figures. In the figures, like reference numerals used in more than one figure indicate a like element, and may be considered in light of the description of the like element presented in any of the other figures having the like element.

BRIEF DESCRIPTION OF THE DRAWINGS

For a fuller understanding of the nature and advantages of this invention, as well as the preferred mode of use, reference should be made to the following detailed description read in conjunction with the accompanying drawings. The drawings are not presented to scale unless specified otherwise on an individual basis.

DETAILED DESCRIPTION

The following description includes the best embodiments presently contemplated for carrying out the invention. This description is made for the purpose of illustrating the general principles of this invention and is not meant to limit the inventive concepts claimed herein in any way.

Figure 1:
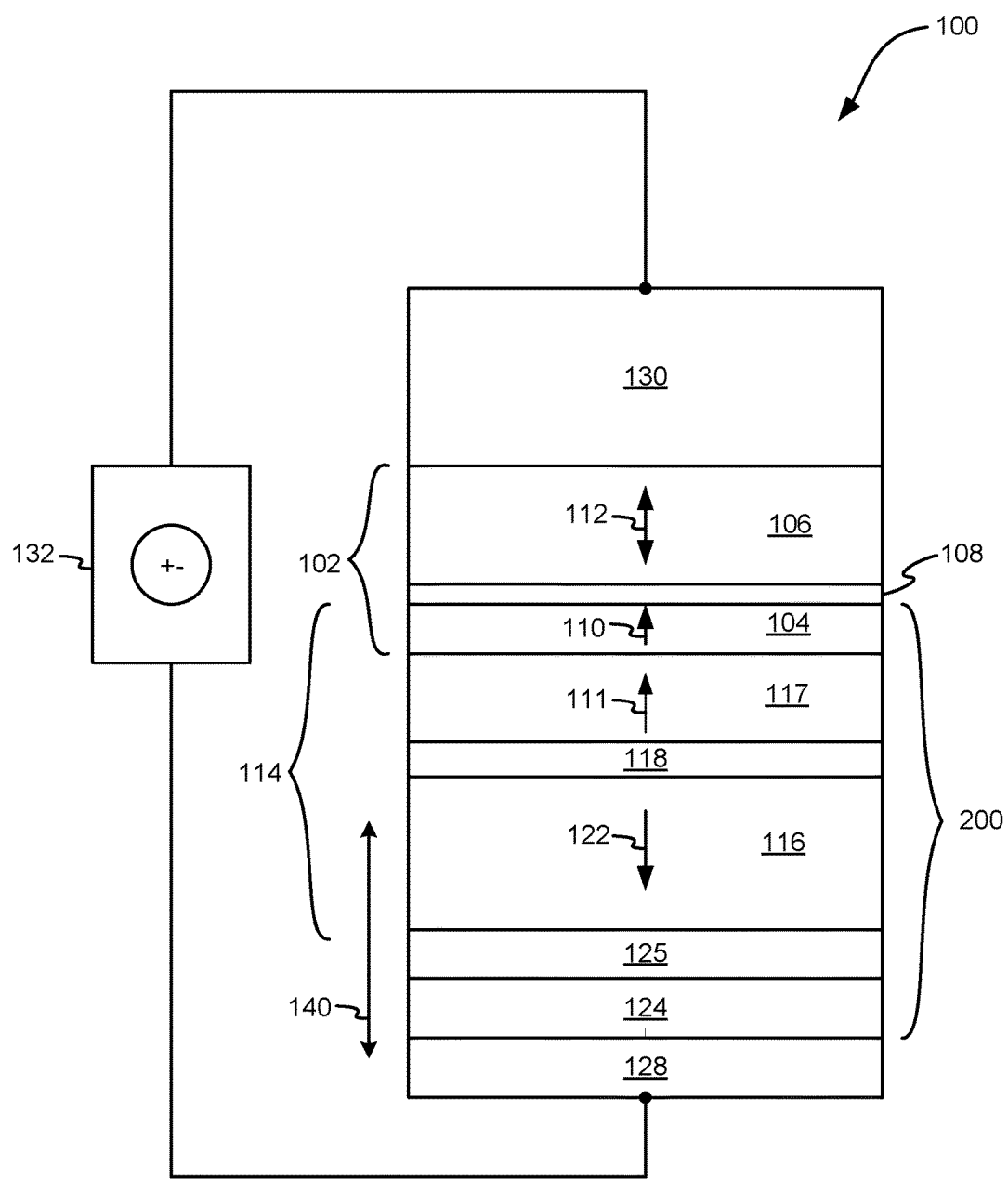
FIG. 1 is a schematic, cross-sectional view of a portion of a magnetic memory element, according to an embodiment.

Referring to FIG. 1, a magnetic memory element 100 is shown according to one embodiment. The memory element 100 may be used in a perpendicular magnetic tunnel junction (pMTJ) memory element, as described in various embodiments herein. The memory element 100 may include a magnetic tunnel junction (MTJ) 102 that may include a magnetic reference layer 104, a magnetic free layer 106, and a thin, non-magnetic, electrically-insulating magnetic barrier layer 108 positioned between the reference layer 104 and the free layer 106 in an element height direction 140. The barrier layer 108 may include an oxide, such as MgO, or some other suitable material known in the art. The reference layer 104 has a magnetization 110 that is fixed in a direction that is perpendicular to a horizontal plane of the layer, as indicated by the arrow. The horizontal plane is sometimes referred to as a plane of formation in the embodiments described herein. The free layer 106 has a magnetization 112 that may be in either of two directions perpendicular to a horizontal plane of the free layer 106, as indicated by the two arrows 112. While the magnetization 112 of the free layer 106 remains in either of two directions perpendicular to the plane of the free layer 106 in a quiescent state, it may be selectably switched between these two directions, as is described in greater detail herein. When the magnetization 112 of the free layer 106 is in the same direction as the magnetization 110 of the reference layer 104, the electrical resistance across the MTJ 102 is at a low resistance state. Conversely, when the magnetization 112 of the free layer 106 is opposite to the magnetization 110 of the reference layer 104, the electrical resistance across the MTJ 102 is in a high resistance state.

The reference layer 104 may be part of an anti-parallel magnetic pinning structure 114 that may include a first magnetic layer structure (SAF1) 116, a second magnetic layer structure (SAF2) 117, and a non-magnetic, antiparallel coupling layer 118 positioned between the SAF1 layer 116 and the SAF2 layer 117 in the element height direction 140. The antiparallel coupling layer 118 may comprise any suitable material known in the art, such as Ru, and may be constructed to have a thickness that causes antiferromagnetic coupling of the SAF1 layer 116 and the SAF2 layer 117. The antiparallel coupling between the SAF1 layer 116 and the SAF2 layer 117 pins the magnetization 111 of the SAF2 layer 117 in a direction that is opposite to that of the magnetization 122 of the SAF1 layer 116. Exchange coupling between the SAF2 layer 117 and the reference layer 104 pins the magnetization 110 of the reference layer 104 in the same direction as the magnetization 111 of the SAF2 layer 117 as shown in FIG. 1.

A lower electrode 128 and an upper electrode 130 may be positioned near a bottom and a top of the memory element 100, respectively, in one approach. The lower electrode 128 and the upper electrode 130 may be constructed of a non-magnetic, electrically conductive material of a type known in the art, such as Au, Ag, Cu, etc., and may provide an electrical connection with a circuit 132. The circuit 132 may include a current source, and may further include circuitry for reading an electrical resistance across the memory element 100.

The magnetic free layer 106 has a magnetic anisotropy that causes the magnetization 112 of the free layer 106 to remain stable in one of two directions perpendicular to the horizontal plane of the free layer 106. In a write mode of use for the memory element 100, the orientation of the magnetization 112 of the free layer 106 may be switched between these two directions by applying an electrical current through the memory element 100 via the circuit 132. A current in a first direction causes the magnetization 112 of the free layer 106 of the memory element 100 to flip to a first orientation, and a current in a second direction opposite to the first direction causes the magnetization 112 of the free layer 106 of the memory element 100 to flip to a second, opposite direction.

For example, if the magnetization 112 is initially oriented in a downward direction in FIG. 1, applying a current in a downward direction through the memory element 100 will cause electrons to flow in an opposite direction upward through the element 100. Electrons travelling through the reference layer 104 become spin polarized as a result of the magnetization 110 of the reference layer 104. These spin-polarized electrons cause a spin torque on the magnetization 112 of the free layer 106, which causes the magnetization 112 to flip directions.

On the other hand, if the magnetization 112 of the free layer 106 is initially in an upward direction in FIG. 1, applying an electrical current through the memory element 100 in an upward direction in FIG. 1 causes electrons to flow in an opposite direction, downward through the memory element 100. Because the magnetization 112 of the free layer 106 is in the same direction as the magnetization 110 of the reference layer 104, the electrons with opposite spin will not be able to pass through the barrier layer 108 into the reference layer 104. As a result, the electrons with the opposite spin will accumulate at the junction between the free layer 106 and the barrier layer 108. This accumulation of spin polarized electrons causes a spin torque that causes the magnetization 112 of the free layer 106 to flip from an upward direction to a downward direction.

Data retention is an important performance parameter for a non-volatile memory such as Magnetic Random Access Memory. "Retention" refers to the ability of a data memory device to maintain recorded data over time at in a variety of environments (such as temperature) without loss of data. The "endurance" of a magnetic memory system refers to the ability to be able to operate over many cycles, while being able to accurately and robustly record magnetic data. One factor that affects the retention and endurance of a magnetic memory element is the ability of the magnetic reference layer 104 to maintain its magnetization 110 over a long period of time and over a wide range of operating conditions such as variations in temperature.

Magnetic stability of the reference layer 104 can be improved by incorporating the reference layer 104 into a synthetic anti-ferromagnetic structure (SAF). Such a structure as shown in FIG. 1 can include a first magnetic layer structure SAF1 116, and a second magnetic layer structure 117, which are both anti-parallel exchange coupled across a non-magnetic exchange coupling layer 118. The Exchange coupling layer 118, which can be a material such as Ru has a thickness that is chosen to anti-parallel couple the magnetic layer structures 116, 117 so that the SAF1 layer 116 has a magnetization 122 that is oriented in a first direction 122 that is perpendicular to the plane of the layer 116. The antiferromagnetic coupling between the SAF1 layer 116 and SAF2 layer 117 causes the SAF2 layer 117 to have a magnetization 111 that is opposite (e.g. anti-parallel with) the magnetization 122 of the SAF1 layer 116, as shown in FIG. 1. The reference layer 104 is magnetically exchange coupled with the SAF2 layer 117 so that it has a magnetization 110 that is pinned in the same direction as the magnetization 111 of the SAF2 layer 117.

Another advantage of the SAF structure described above is that the magnetic moment of the layer 116 can be balanced with the magnetic layers 117, 104 to result in a net zero or nearly net zero magnetic moment. This advantageously result in little or no dipole fringing field which would otherwise negatively affect the magnetization 112 of the magnetic free layer 106, and which could result in instability of the magnetic free layer 106 and loss of data retention.

Even with the advantage of the SAF structure described above, there remains a need to ensure strong magnetic pinning of the magnetization 110 of the reference layer 104 in a direction that is perpendicular to the plane of the layer 104. Improvement in magnetic pinning in the perpendicular direction can be greatly enhanced by increasing the perpendicular magnetic anisotropy of the reference layer 104 as well as the SAF1 and SAF2 layers 116, 117. A structure for increasing this perpendicular magnetic anisotropy is described herein below.

Figure 2:
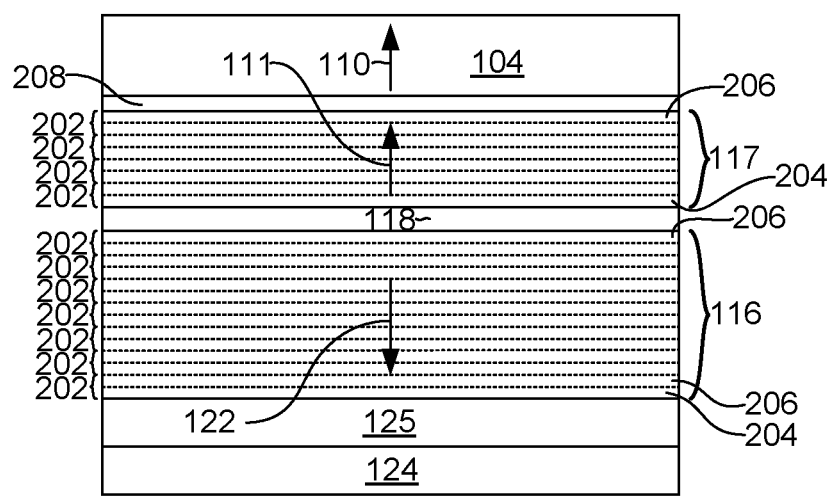
FIG. 2 an enlarged view of a portion of the magnetic memory element shown in bracket 200 in FIG. 1.

FIG. 2 shows an enlarged view of the layers enclosed by the bracket 200 of FIG. 1, which shows a synthetic antiferromagnetic (SAF) structure 200 formed on a seed layer 124, and under-layer 125. Perpendicular magnetic tunnel junctions (pMTJ) require highly stable reference layers in order to ensure high endurance and error free operation as a memory device. In order to ensure magnetic stability of the reference layer 104, the magnetic layers 116, 117, 104 preferably have a high perpendicular magnetic anisotropy. The present invention, an embodiment of which is described with reference to FIG. 2, provides very strong magnetic pinning of the reference layer 104 through use of a perpendicular synthetic antiferromagnetic structure, which uses a specific arrangement of Co/Pt multi-layers to improve antiferromagnetic exchange coupling, perpendicular magnetic anisotropy and magnetic moment balance in a perpendicular synthetic antiferromagnetic structure.

As shown in FIG. 2, each of the SAF1 layer 116 and SAF2 layer 117 is formed as a repeating series of bi-layers 202 of Pt and Co layers 204, 206. In the structure shown in FIG. 2, the Pt/Co bi-layers 202 are constructed so that the Pt layer 204 is deposited first and the Co layer 206 is deposited over the Pt layer 204. Deposition of the bi-layers of these layers 204, 206 in this arrangement greatly increases the perpendicular ferromagnetic exchange coupling field (Hex) between the layers of the SAF1 and SAF2 layers 116, 117, resulting in greatly improved pinning of the magnetization 110 of the reference layer 104. Such a structure can result in the SAF1 and SAF 2 layers 116, 117 each having an effective perpendicular magnetization of at least 10 kGauss, and each having a magnetization not greater than 1000 emu/cc.

In addition, the use of multiple bi-layers 202 in the SAF1 and SAF2 layers 116, 117 allows for lower magnetic moment of these layers 116, 117, which advantageously facilitates the balancing of magnetic moments of SAF1 116 with respect to SAF2 117. This results in a decrease in dipolar field offset of the magnetic free layer 106 (FIG. 1) ($H_{in}$) due to the reduction of fringing fields emerging from the SAF structure as a whole (e.g. SAF1 116, SAF2 117, and reference layer 104).

With continued reference to FIG. 2, the order of each of the bi-layers 202 is such that the Pt layer 204 is deposited prior to the layer of Co 206 (e.g. below the Co layer). In this arrangement, for the SAF1 structure 116, a layer of Pt 204 is in contact with the under-layer 125, and a layer of Co 206 is in contact with the anti-parallel exchange coupling layer 118. Similarly, for the SAF2 structure 117, a layer of Pt 204 is in contact with the anti-parallel exchange coupling layer 118 and a layer of Co 206 is in contact with the coupling layer 208. The coupling layer 208 includes one or more materials of Co, W, Mo, Ta in the thickness range of 2-10 Angstroms that can ensure that the SAF2 structure 117 is strongly parallel exchange coupled with the reference layer 104. This arrangement of layers 204, 206 greatly increases the effectiveness of increasing perpendicular magnetic anisotropy and minimizing magnetic moment of the SAF1 and SAF2 structures 116, 117. Reversing the order of the layers 204, 206 for the same range of thicknesses and same amount of deposited materials does not lead to the same magnetic moment improvements in the SAF1 and SAF2 structures 116, 117. The deposition of the Pt layers 204 before the Co layers 206 as shown in FIG. 2 improves antiferromagnetic exchange coupling field (Hex) through Ru and increases the perpendicular magnetic anisotropy of the SAF structure. It also results in lower magnetic moment for the SAF1 and SAF2 structures 116, 117. This advantageously results in decreased dipolar field offset for the free layer (Hin) due to reduced fringing fields emerging from the entire SAF structure which would otherwise act on the free layer.

Further, the number of Pt/Co bi-layers 202 that can be included in each of the SAF1 and SAF2 structures 116, 117 can be adjusted to minimize this dipolar field offset, and optimize perpendicular magnetic anisotropy. In an exemplary embodiment shown in FIG. 2, the SAF1 structure 116 has seven Pt/Co bi layer structures 202, while the SAF2 structure has 4 Pt/Co bi-layer structures 202. These numbers can be adjusted however. For example, the SAF1 structure 116 could have 5-9 bi-layer structures 202, while the SAF2 structure 117 could have 2-6 bi-layer structures 202. Because the SAF2 structure 117 is magnetically coupled with the reference layer 104, including a greater number of bi-layers 202 in the SAF1 structure 116 than in the SAF2 structure 117 can help to balance the dipole fields which include the contribution from the reference layer structure 104.

Figure 3:
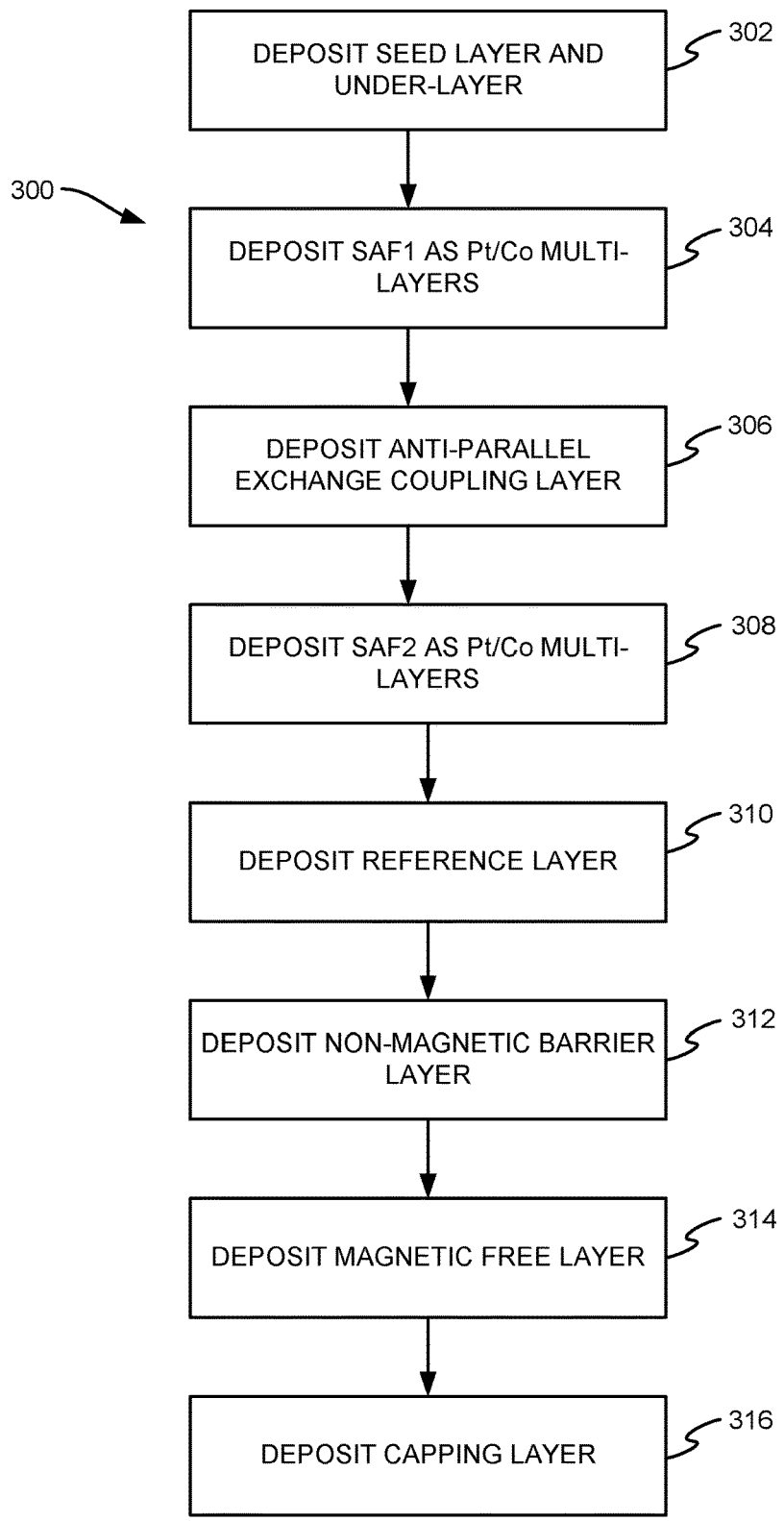
FIG. 3 is a flowchart illustrating a method for manufacturing a magnetic memory element according to an embodiment.

FIG. 3 shows a flowchart that illustrates a method 300 for manufacturing a magnetic recording element according to an embodiment. In a step 302 a seed layer and under-layer are deposited. Then, in a step 304 an SAF1 structure is formed by sequentially depositing multiple layers of Pt and Co, as a series of bi-layers of Pt and Co. The deposition of Pt and Co can be performed in a sputter deposition tool having both Pt and Co targets. Tooling can be provided to select between the Pt and Co targets. The deposition is performed such that Pt is deposited first, followed by Co, and this process is completed for a selected number of repetitions to create a selected number of Pt/Co bi-layers. Preferably, this process is repeated 5-9 times to create 5 to 9 Pt/Co bi-layers. More preferably, this deposition process is repeated 7 times to create 7 Pt/Co bi-layers.

Then, in a step 306 an anti-parallel exchange coupling layer is deposited. The anti-parallel exchange coupling layer can be Ru and is deposited to a thickness that is selected to provide anti-parallel exchange coupling between an SAF1 and SAF2 layer structures. Then, in a step 308 an SAF2 structure is formed on the anti-parallel exchange coupling layer by sequentially depositing multiple layers of Pt and Co, as a series of bi-layers of Pt and Co. The deposition of Pt and Co can be performed in a sputter deposition tool having both Pt and Co targets. Tooling can be provided to select between the Pt and Co targets. The deposition is performed such that Pt is deposited first, followed by Co, and this process is completed for a selected number of repetitions to create a selected number of Pt/Co bi-layers. Preferably, this process is repeated 2-6 times to create 2 to 6 Pt/Co bi-layers. More preferably, this deposition process is repeated 4 times to create 4 Pt/Co bi-layers.

Then, in a step 310 a magnetic reference layer is deposited over the SAF2 structure. The reference layer can be a magnetic material such as CoFeB. Another layer, such as an exchange coupling layer may also be deposited between the SAF2 structure and the magnetic reference layer. The exchange coupling layer may include one or more materials of Co, W, Mo, Ta in the thickness range of 2-10 Angstroms. Then, in a step 312, a non-magnetic barrier layer such as MgO is deposited over the magnetic reference layer. In a step 314, a magnetic free layer structure such as CoFeB is deposited over the non-magnetic barrier layer. Then, in a step 316 a capping layer structure is deposited over the magnetic free layer. The capping layer structure can include one or more layers of Ta, Ru or some other material.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetic memory element, comprising:
a magnetic reference layer;
a magnetic free layer;
a non-magnetic barrier layer located between the magnetic free layer and the magnetic reference layer; and
a synthetic antiferromagnetic structure, further comprising:
a first multilayer structure comprising a plurality of bi-layers of Pt and Co;
a second multi-layer structure comprising a plurality of bi-layers of Pt and Co; and
a non-magnetic anti-parallel exchange coupling layer located between the first multi-layer structure and the second multilayer structure;
wherein each of the plurality of bi-layers of Pt and Co in each of the first and second multi-layer structures is configured so that the layer of Co is formed over the layer of Pt;
wherein the second multi-layer structure is exchange coupled with the magnetic reference layer.

2. The magnetic memory element as in claim 1, wherein the first multi-layer structure is formed on an under-layer, and wherein a bi-layer of the first multi-layer structure is configured such that it has a layer of Pt in contact with the under-layer.

3. The magnetic memory element as in claim 1, wherein the first multi-layer structure has a greater or equal number of Pt/Co bilayers than the second multi-layer structure.

4. The magnetic memory element as in claim 1, wherein:
the first multi-layer structure has 5-9 Pt/Co bi-layers; and
the second multi-layer structure has 2-6 Pt/Co bi-layers.

5. The magnetic memory element as in claim 1, wherein each of the first and second multi-layer structures has a perpendicular magnetic anisotropy.

6. The magnetic memory element as in claim 1, wherein each of the first and second multi-layer structures has an effective perpendicular magnetization of at least 10 kGauss.

7. The magnetic memory element as in claim 1, wherein each of the first and second multi-layer structures has a magnetization that is not greater than 1000 emu/cc.

8. The magnetic memory element as in claim 1, wherein each of the first and second multi-layer structures has an effective perpendicular magnetization of at least 10 kGauss and has a magnetization not greater than 1000 emu/cc.

9. The magnetic memory element as in claim 1, wherein the non-magnetic antiparallel exchange coupling layer comprises Ru.

10. The magnetic memory element as in claim 1, wherein the magnetic reference layer comprises CoFeB.

11. The magnetic memory element as in claim 1, further comprising a ferromagnetic coupling layer located between the second multi-layer structure and the magnetic reference layer.

12. The magnetic memory element as in claim 11, wherein the ferromagnetic coupling layer comprises one or more materials of Co, W, Mo and Ta.

13. A magnetic memory element, comprising:
a magnetic reference layer;
a magnetic free layer;
a non-magnetic barrier layer located between the magnetic free layer and the magnetic reference layer; and
a synthetic antiferromagnetic structure, further comprising:
a first multilayer structure comprising a plurality of bi-layers of Pt and Co;
a second multi-layer structure comprising a plurality of bi-layers of Pt and Co; and
a non-magnetic anti-parallel exchange coupling layer located between the first multi-layer structure and the second multilayer structure;
wherein:
the second multi-layer structure is exchange coupled with the magnetic reference layer;
the first multi-layer structure has 7 Pt/Co bi-layers; and
the second multi-layer structure has 4 Pt/Co bi-layers.

* * * * *